United States Patent
Morris (10) Patent No.: US 6,975,514 B2
(45) Date of Patent: Dec. 13, 2005

(54) INTEGRATED VCSELS ON TRADITIONAL VLSI PACKAGING

(75) Inventor: Terrel L. Morris, Garland, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/355,419

(22) Filed: Jan. 31, 2003

(65) Prior Publication Data

US 2005/0167823 A1  Aug. 4, 2005

(51) Int. Cl.[7] .............................................. H05K 1/00
(52) U.S. Cl. ..................... 361/749; 361/750; 438/27; 438/28; 257/431; 257/433
(58) Field of Search .................. 361/760, 730, 361/772, 774, 776, 807, 813, 723, 749–751; 174/262, 260; 257/777, 431–433, 443–444, 257/448, 723; 439/493, 27–28, 34–35, 65–66, 439/116; 438/27–28, 34–35, 65, 66, 116

(56) References Cited

U.S. PATENT DOCUMENTS

| | | | |
|---|---|---|---|
| 5,978,401 A | 11/1999 | Morgan | |
| 6,069,991 A * | 5/2000 | Hibbs-Brenner et al. | ..... 385/50 |
| 6,334,784 B1 | 1/2002 | Howard | |
| 6,392,296 B1 | 5/2002 | Ahn et al. | |
| 6,424,530 B1 | 7/2002 | Lee et al. | |
| 6,527,456 B1 | 3/2003 | Trezza | |
| 6,665,498 B1 * | 12/2003 | Jiang et al. | ..... 398/135 |
| 2002/0104959 A1 * | 8/2002 | Arsenault et al. | |

OTHER PUBLICATIONS

A.F.J. Levi, "Optical Interconnects in Systems", 2000, pp. 1-8.

* cited by examiner

Primary Examiner—Kamand Cuneo
Assistant Examiner—Hung S. Bui
(74) Attorney, Agent, or Firm—Leslie P. Gehman (57) ABSTRACT

A circuit module including at least one Application Specific Integrated Circuit (ASIC) and a plurality of Vertical Cavity Surface-Emitting Laser (VCSEL) array modules is built using a standard ceramic or organic VLSI package substrate, resulting is a high density device with a small footprint. Interconnection between the electronic devices and the VCSEL array modules is accomplished using standard integrated circuit packaging technology and flexible connectors. Optical connections from the VCSEL arrays to fiber optic cables are made possible by integrating industry-standard optical connectors onto the package. Optical receiver and transceiver modules may also be incorporated into the circuit module.

23 Claims, 11 Drawing Sheets

INTEGRATED VCSELS ON TRADITIONAL VLSI PACKAGING

FIELD OF THE INVENTION

The present invention is related generally to the field of integrated circuit modules and more specifically to the field of integrated circuit modules including vertical cavity surface-emitting lasers.

BACKGROUND OF THE INVENTION

Vertical Cavity Surface Emitting Laser (VCSEL) arrays are often used in fiber optic communications. These VCSEL arrays are capable of transmitting large amounts of data over small optical fibers. A single ⅛ inch fiber bundle may carry an entire 12–20 bit logical port running at relatively high speeds. VCSEL arrays are constructed using semiconductor process techniques similar to those used in silicon integrated circuits, however, the process techniques used for VCSEL arrays may not be optimal for construction of high speed silicon integrated circuits. This makes it difficult to integrate VCSEL arrays and high speed circuits on the same silicon device.

Many current uses of VCSEL technology require precise performance specifications in order to transmit signals over long distances via optical fibers. However, in situations where only short distances are required, such as within a computer server or within a single data center, less stringent performance specifications are required of the VCSEL arrays.

Currently, some circuit boards include VCSEL array modules and receiver modules for communication between computers. Typically, these modules are placed along one edge of the board and electrically connected to one or more electronic devices attached to the board. These solutions work well, however as computer speeds continue to increase, the delay inherent in driving signals out of an electronic device, into a board, along a board electrical connector, and into a VCSEL array module becomes increasingly troublesome to engineers designing high-speed computers.

Further, board space may be very expensive and in short supply especially in devices such as desktop systems or blade servers. The footprint of separate VCSEL array modules and, if needed, their translator/terminator devices may become a substantial portion of total board area, thus increasing size and costs of the computer.

SUMMARY OF THE INVENTION

A circuit module including at least one Application Specific Integrated Circuit (ASIC) and a plurality of Vertical Cavity Surface-Emitting Laser (VCSEL) array modules is built using a standard ceramic or organic VLSI package substrate, resulting is a high density device with a small footprint. Interconnection between the electronic devices and the VCSEL array modules is accomplished using standard integrated circuit packaging technology and flexible connectors. Optical connections from the VCSEL arrays to fiber optic cables are made possible by integrating industry-standard optical connectors onto the package. Optical receiver and transceiver modules may also be incorporated into the circuit module.

Other aspects and advantages of the present invention will become apparent from the following detailed description, taken in conjunction with the accompanying drawings, illustrating by way of example the principles of the invention.

DETAILED DESCRIPTION

Figure 1:
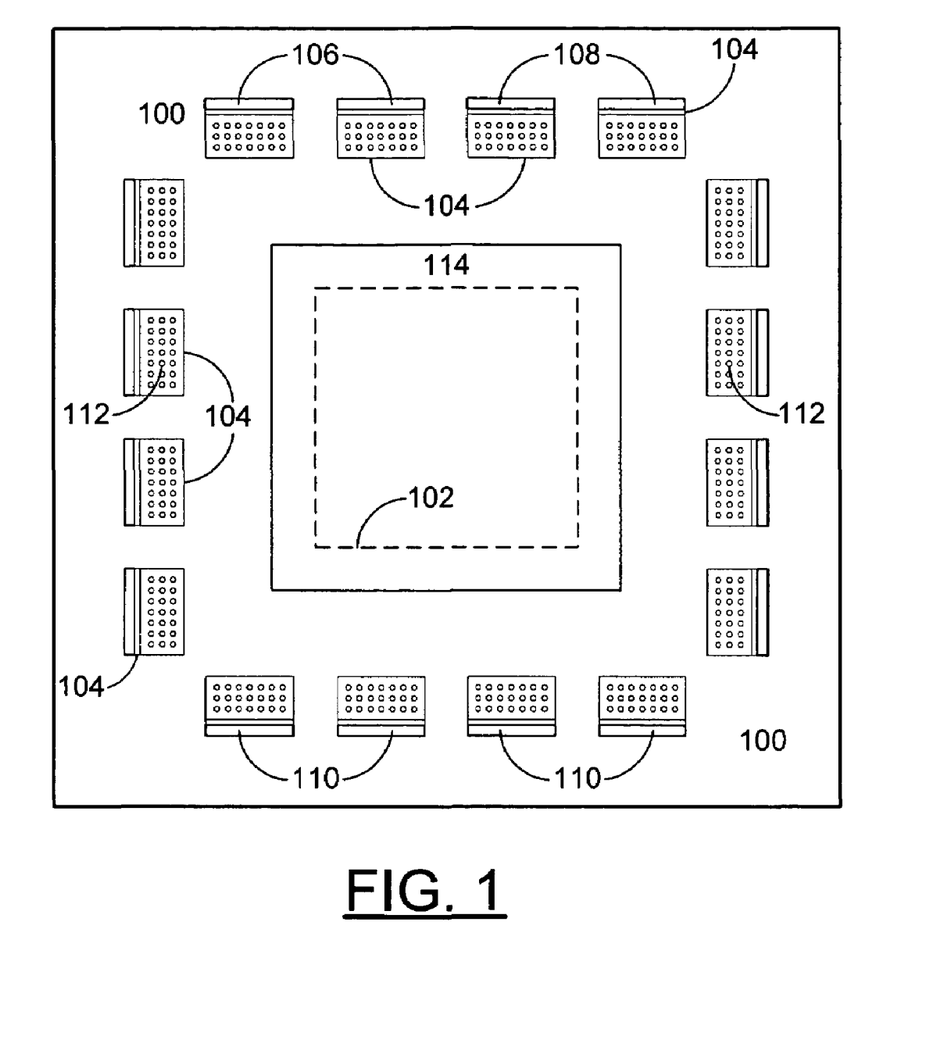
FIG. 1 is a top view of an example embodiment of a VLSI circuit module including a plurality of integrated VCSEL array modules according to the present invention.

FIG. 1 is a top view of an example embodiment of a VLSI circuit module including a plurality of integrated VCSEL array modules according to the present invention. A standard VLSI package substrate 100 constructed of a common package material, such as a ceramic or organic material, is shown in this example embodiment of the present invention with a single large application specific integrated circuit (ASIC) 102 attached to the substrate 100 underneath a standard heat spreader 114. Another invention including integrated VCSELs is described in a U.S. patent application, Ser. No. 10/318,473. "Circuit Module Including Integrated VCSELs", filed on Dec. 12, 2002, and incorporated herein by reference. Another invention including VCSELs on ASIC substrates is described in a U.S. patent application, Ser. No. 10/355,663, "Integrated VCSELs on ASIC Module Using Flexible Electrical Connections", filed on Jan. 31, 2003, and incorporated herein by reference. The ASIC 102 may be any one of a number of integrated circuit devices, such as a microprocessor, memory, cross-bar, cache controller, FPGA, or any of a number of large scale integrated (LSI) or very large scale integrated (VLSI) circuits. Also present on the substrate are a quantity of VCSEL array modules 106, receivers 108, and transceivers 110. Signal ports 112 connect the ASIC 102 to the VCSEL array modules 106, receivers 108, and the transceivers 110 through small flexible connectors 104. The small flexible connectors 104 allow a 90-degree transition in signal direction in an electrical rather than an optical path resulting in less complexity and ease of manufacturing. Since the light beam from a VCSEL is emitted perpendicular to the surface of the VCSEL, when a VCSEL is attached to the flexible connector 104 which includes a 90-degree bend, the VCSEL itself is now perpendicular to the plane of the ASIC substrate 100 and the light from the VCSEL is emitted in a plane parallel to that of the ASIC substrate 100. The plurality of signal lines connecting the ASIC 102 to the signal ports 112 within the substrate 100 are not shown in this figure for clarity reasons. In an example embodiment of the present invention the VCSEL array modules 106 may incorporate industry standard optical connectors into the module allowing optical connection from the VCSEL array modules 106 using industry standard connections. In this example embodiment of the present invention, the VCSEL circuit is perpendicular to the plane of the substrate 100 and the industry standard connectors are attached such that light is transmitted in a plane parallel to that of the substrate 100. Note that this example embodiment shows a total of 16 VCSEL ray modules 106, receivers 108 and transceivers 110, Those of skill in the art will recognize that any number and any combination of VCSEL array modules 106, receivers 108, and transceivers 110 may be used within the scope of the present invention.

Figure 2:
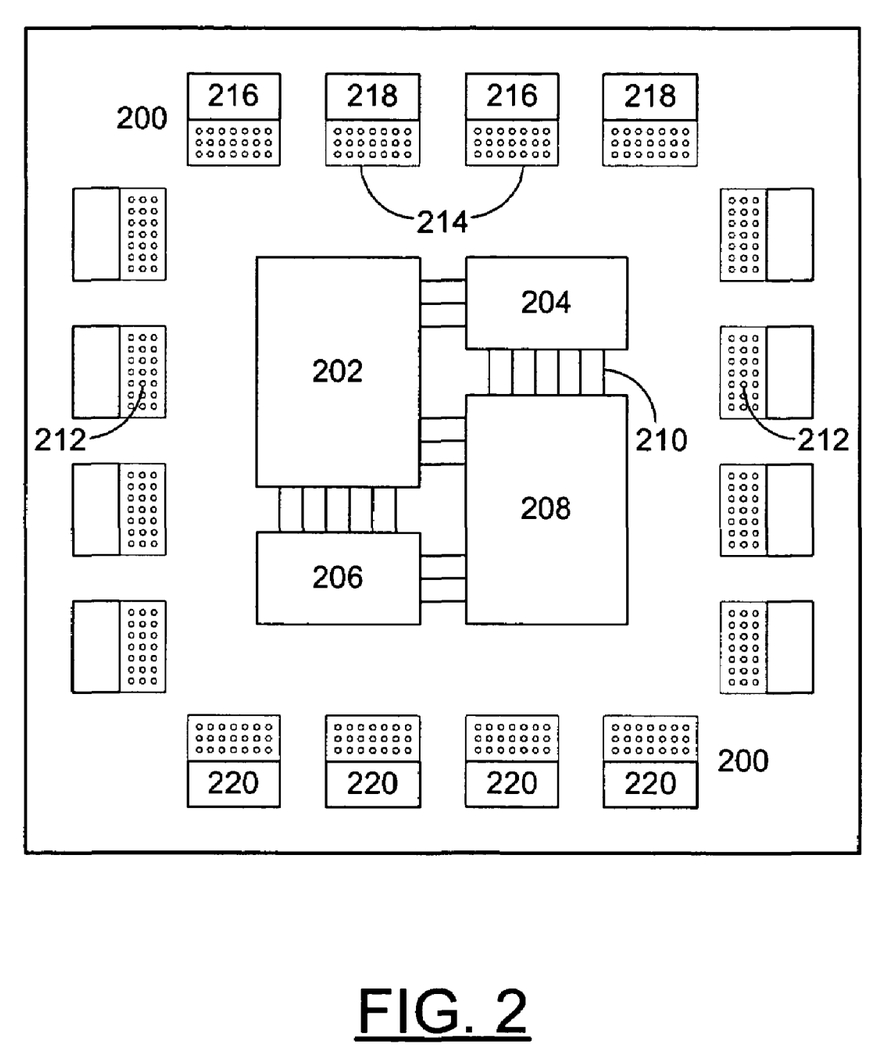
FIG. 2 is a top view of an example embodiment of a VLSI circuit module including a plurality of integrated VCSEL array modules according to the present invention.

FIG. 2 is a top view of an example embodiment of a VLSI circuit module including a plurality of integrated VCSEL array modules according to the present invention. The example embodiment of the present invention shown in FIG. 2 is similar to that of FIG. 1 with the exception that instead of a single ASIC 102 attached to a substrate 100, a first ASIC 202, a second ASIC 204, a third ASIC 206, and a fourth ASIC 208 are attached to the substrate 200. Also, FIG. 2 does not include a heat spreader so that the individual ASICs and their interconnections are visible. Signal ports 212 connect the ASICs 202, 204, 206, and 208 to the VCSEL array modules 216, receivers 218, and the transceivers 220 through small flexible connectors 214. The small flexible connectors 214 allow a 90-degree transition in signal direction in an electrical rather than an optical path resulting in less complexity and ease of manufacturing. The plurality of signal lines connecting the ASICs 202, 204, 206, and 208 to the signal ports 212 within the substrate 200 are not shown in this figure for clarity reasons. In an example embodiment of the present invention the VCSEL array modules 216 may incorporate industry standard optical connectors into the module allowing optical connection from the VCSEL array modules 216 using industry standard connections. Similar to FIG. 1, in this example embodiment of the present invention, the VCSEL circuit is perpendicular to the plane of the substrate 200 and the industry standard connectors are attached such that light is transmitted in a plane parallel to that of the substrate 200. Note that this example embodiment shows a total of 16 VCSEL array modules 216, receivers 218 and transceivers 220. Those of skill in the art will recognize that any number and any combination of VCSEL array modules 216, receivers 218, and transceivers 220 may be used within the scope of the present invention. Also present in this example embodiment of the present invention are a plurality of signal lines 210 electrically connecting the four ASICs 202, 204, 206, and 208 to each other.

Figure 3A:
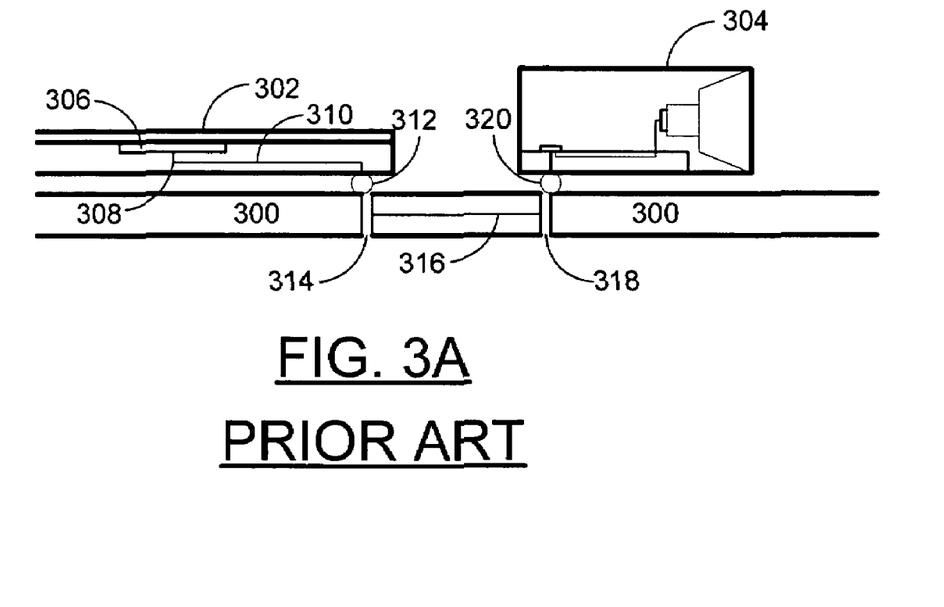
FIG. 3A is a cross-sectional view of an example embodiment of a prior art circuit module connecting to an external VCSEL.

FIG. 3A is a cross-sectional view of an example embodiment of a prior art circuit module connecting to an external VCSEL. An electronic device 306 is shown attached to a first package 302 through a C4 attach bump 308. Within the first package 302, a package trace 310 electrically connects the electronic device 306 to a first ball grid array (BGA) ball 312. This first BGA ball 312 electrically connects the first package 302 to a board 300. Within the board 300, a first board via 314 electrically connects the BGA ball 312 to a board trace 316, and through the board trace 316 to a second board via 318. This second board via 318 is electrically coupled to a second BGA ball 320 attached to a second package 304 containing a VCSEL.

Figure 3B:
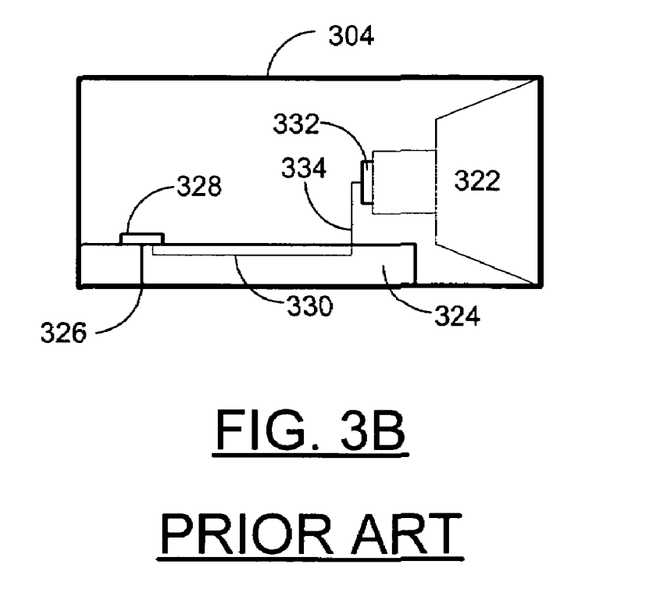
FIG. 3B is a cross-sectional view of the external VCSEL shown in FIG. 2A.

FIG. 3B is a cross-sectional view of the external VCSEL shown in FIG. 3A. Within the second package 304 a second package via 326 electrically couples the second BGA ball 320 to a package pad 328, which is in turn electrically connected to a VCSEL 332 through a second package trace 330 and a flexible electrical conductor 334. The VCSEL 332 is then optically coupled to an industry standard optical connector 322. Note that in this example embodiment of a VCSEL module, the VCSEL 332 is configured perpendicular to the board 300. Thus the light emitted from the VCSEL is in a plane parallel to the board 300 and the industry standard optical connector 322 is configured to route any optical conductors in a plane parallel to the board 300.

Figure 4:
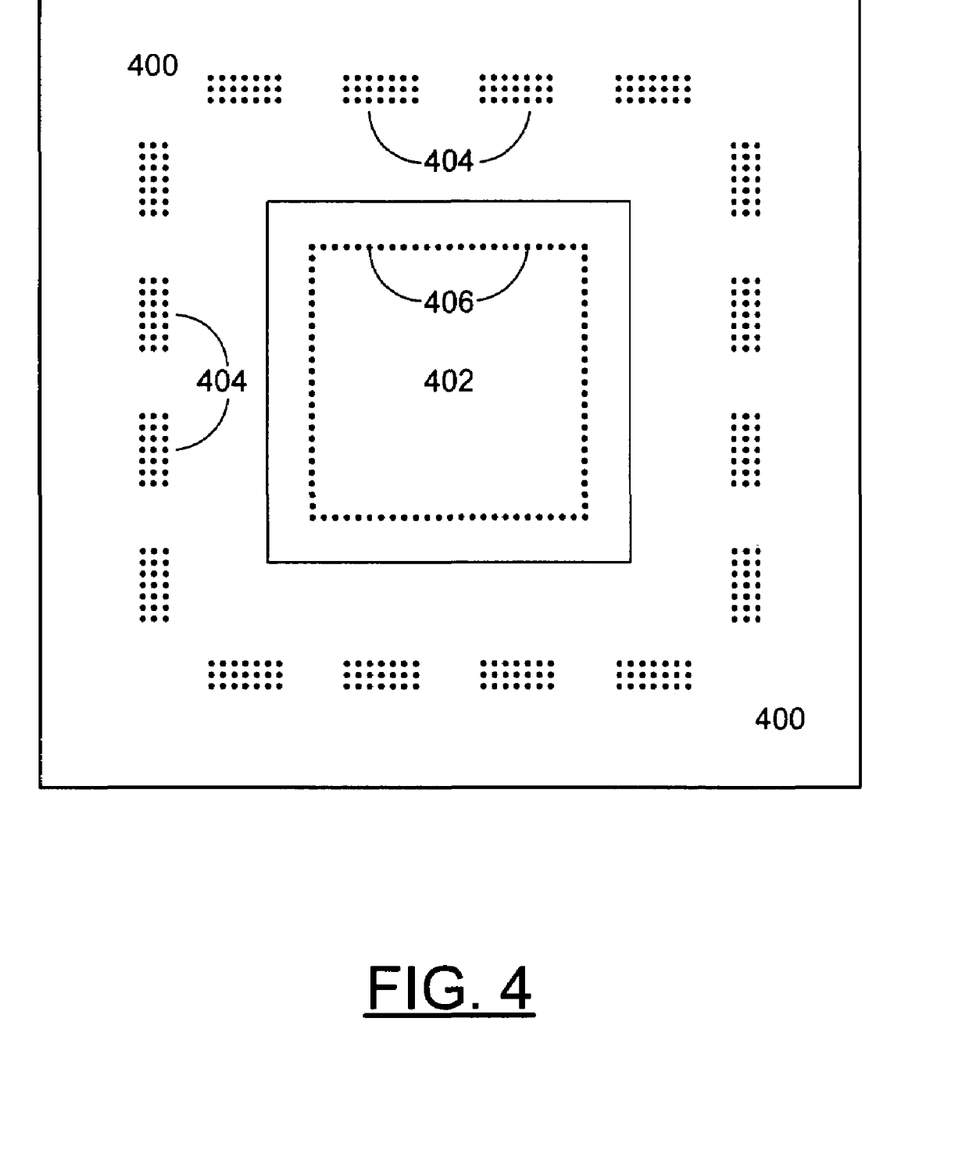
FIG. 4 is a top view of an example embodiment of a VLSI circuit module before attachment of a plurality of integrated VCSEL array modules according to the present invention.

FIG. 4 is a top view of an example embodiment of a VLSI circuit module substrate before attachment of a plurality of integrated VCSEL array modules according to the present invention. A standard VLSI circuit substrate 400 is shown including a cavity 402 and a plurality of signal ports 404. Within the cavity 402 are a plurality of VLSI signal ports 406 that are electrically connected to the signal ports 404 through conductors within the substrate 400. These conductors are not shown in this figure for clarity.

Figure 5A:
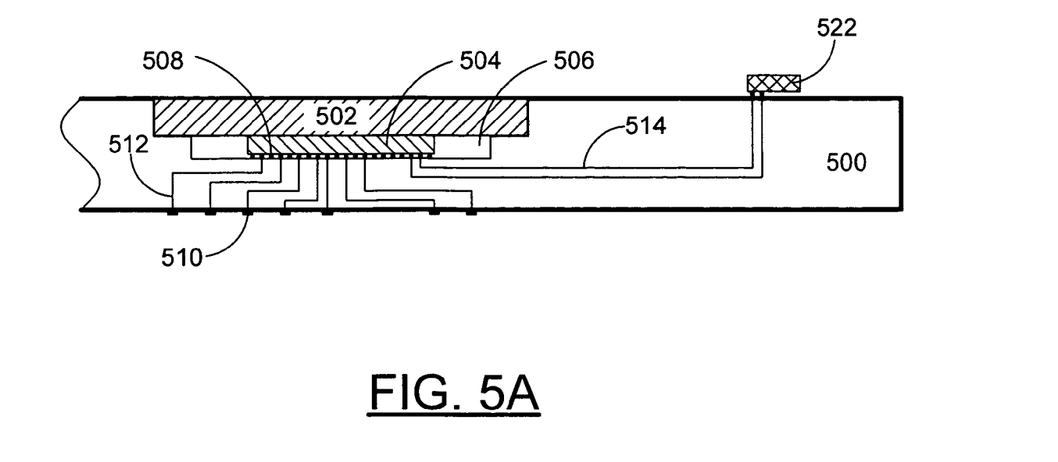
FIG. 5A is a cross-sectional view of an example embodiment of a VLSI circuit module including a plurality of integrated VCSEL array modules according to the present invention.

FIG. 5A is a cross-sectional view of an example embodiment of a VLSI circuit module including a plurality of integrated VCSEL array modules according to the present invention. A substrate 500 is shown including a cavity 506. Those of skill in the art will recognize that alternate package and heat spreader arrangements without a cavity may be used within the scope of the present invention. Within the cavity 506 is an ASIC 504 electrically connected to VLSI signal ports 508 on the substrate 500. A heat spreader 502 is thermally coupled to the ASIC and mechanically coupled to the substrate 500 sealing the cavity 506. ASIC signal lines 512 run through the substrate 500 to standard package pads 510. Those of skill in the art will recognize that these package pads 510 may be constructed in a wide variety of styles and configurations within the scope of the present invention. For example, the package may be a ball grid array (BGA) package and the package pads 510 would then comprise individual solder balls. VCSEL signal lines 514 run through the substrate 500 to VCSEL signal ports 516. A VCSEL array 522 is electrically connected to the VCSEL signal ports 516. Note that in this example embodiment of the present invention, the VCSEL array 522 is in a plane parallel to that of the substrate 500 and the light emitted from the VCSEL array 522 is in a plane perpendicular to that of the substrate 500.

Figure 5B:
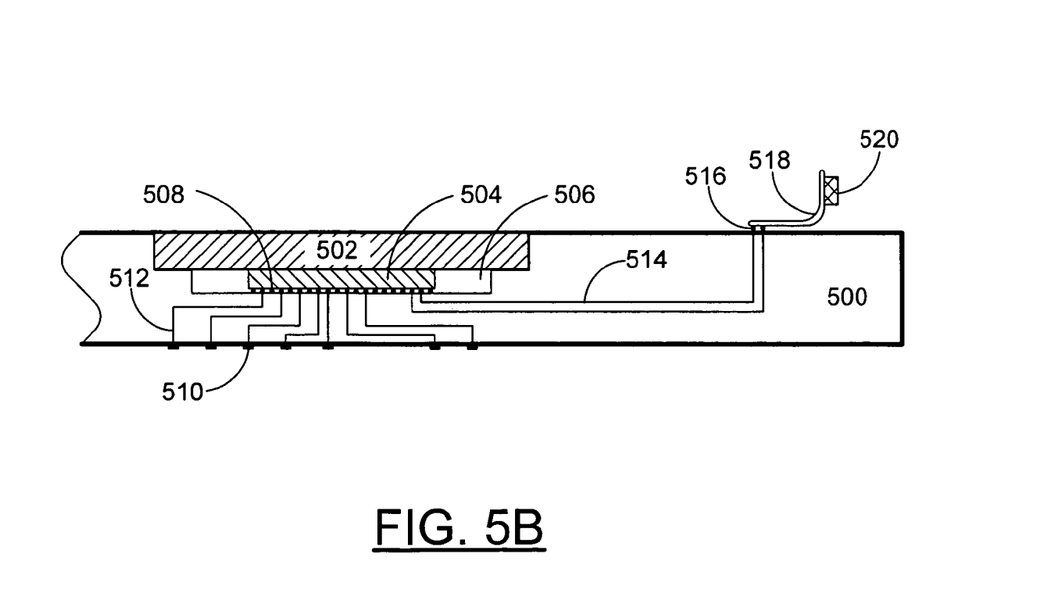
FIG. 5B is a cross-sectional view of an example embodiment of a VLSI circuit module including a plurality of integrated VCSEL array modules according to the present invention.

FIG. 5B is a cross-sectional view of an example embodiment of a VLSI circuit module including an integrated VCSEL array module according to the present invention.

FIG. 5B is identical to FIG. 5A with the exception that the VCSEL array is attached to the substrate 500 through a flexible connector 518 rather than directly. A substrate 500 is shown including a cavity 506. Those of skill in the art will recognize that alternate package and heat spreader arrangements without a cavity may be used within the scope of the present invention. Within the cavity 506 is an ASIC 504 electrically connected to VLSI signal ports 508 on the substrate 500. A heat spreader 502 is thermally coupled to the ASIC and mechanically coupled to the substrate 500 sealing the cavity 506. ASIC signal lines 512 run through the substrate 500 to standard package pads 510. Those of skill in the art will recognize that these package pads 510 may be constructed in a wide variety of styles and configurations within the scope of the present invention. For example, the package may be a ball grid array (BGA) package and the package pads 510 would then comprise individual solder balls. VCSEL signal lines 514 run through the substrate 500 from the ASIC 504 to VCSEL signal ports 516. A VCSEL array 520 is electrically connected to the VCSEL signal ports 516 through a small flexible circuit board 518. Since the light beam from a VCSEL is emitted perpendicular to the surface of the VCSEL, when a VCSEL is attached to the flexible circuit board 518 which includes a 90-degree bend, the VCSEL itself is now perpendicular to the plane of the substrate 500 and the light from the VCSEL is emitted in a plane parallel to that of the substrate 500. The small flexible circuit board 518 contains electrical traces configured to connect the VCSEL array 520 to the VCSEL signal ports 516.

Figure 6:
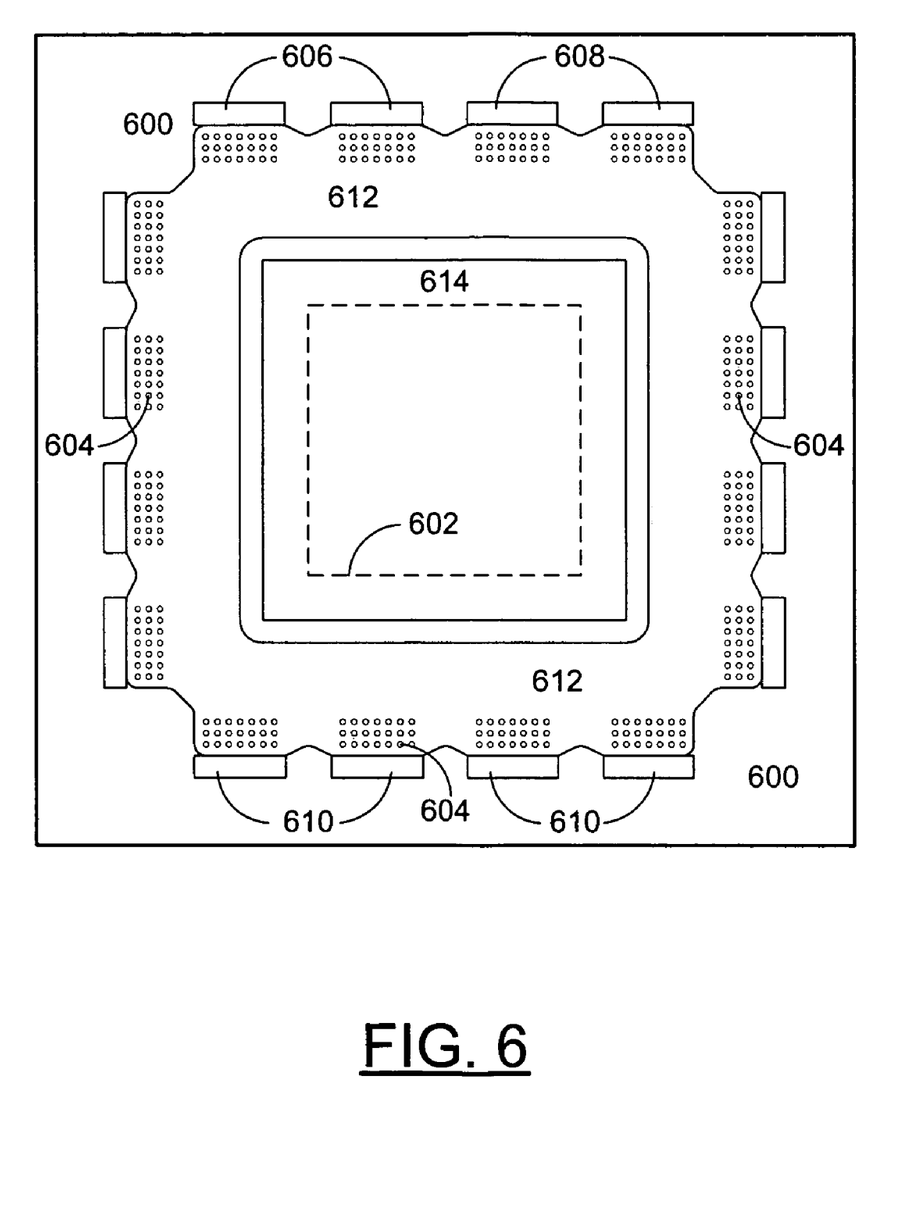
FIG. 6 is a top view of an example embodiment of a VLSI circuit module including a plurality of integrated VCSEL array modules according to the present invention.

FIG. 6 is a top view of an example embodiment of a VLSI circuit module including a plurality of integrated VCSEL array modules according to the present invention. A standard VLSI package substrate 600 constructed of a common package material, such as a ceramic or organic material, is shown in this example embodiment of the present invention with a single large application specific integrated circuit (ASIC) 602 attached to the substrate 600 underneath a standard heat spreader 614. The ASIC 602 may be any one of a number of integrated circuit devices, such as a microprocessor, memory, cross-bar, cache controller, FPGA, or any of a number of large scale integrated (LSI) or very large scale integrated (VLSI) circuits. Also present on the substrate are a quantity of VCSEL array modules 606, receivers 608, and transceivers 610. Signal ports 604 connect the ASIC 602 to the VCSEL array modules 606, receivers 608, and the transceivers 610 through a single large flexible connector 612. The plurality of signal lines connecting the ASIC 602 to the signal ports 604 within the substrate 600 are not shown in this figure for clarity reasons. In an example embodiment of the present invention the VCSEL array modules 606 may incorporate industry standard optical connectors into the module allowing optical connection from the VCSEL array modules 606 using industry standard connections. In this example embodiment of the present invention, the VCSEL circuit is perpendicular to the plane of the substrate 600 and the industry standard connectors are attached such that light is transmitted in a plane parallel to that of the substrate 600. Note that this example embodiment shows a total of 16 VCSEL array modules 606, receivers 608 and transceivers 610. Those of skill in the art will recognize that any number and any combination of VCSEL array modules 606, receivers 608, and transceivers 610 may be used within the scope of the present invention.

Figure 7:
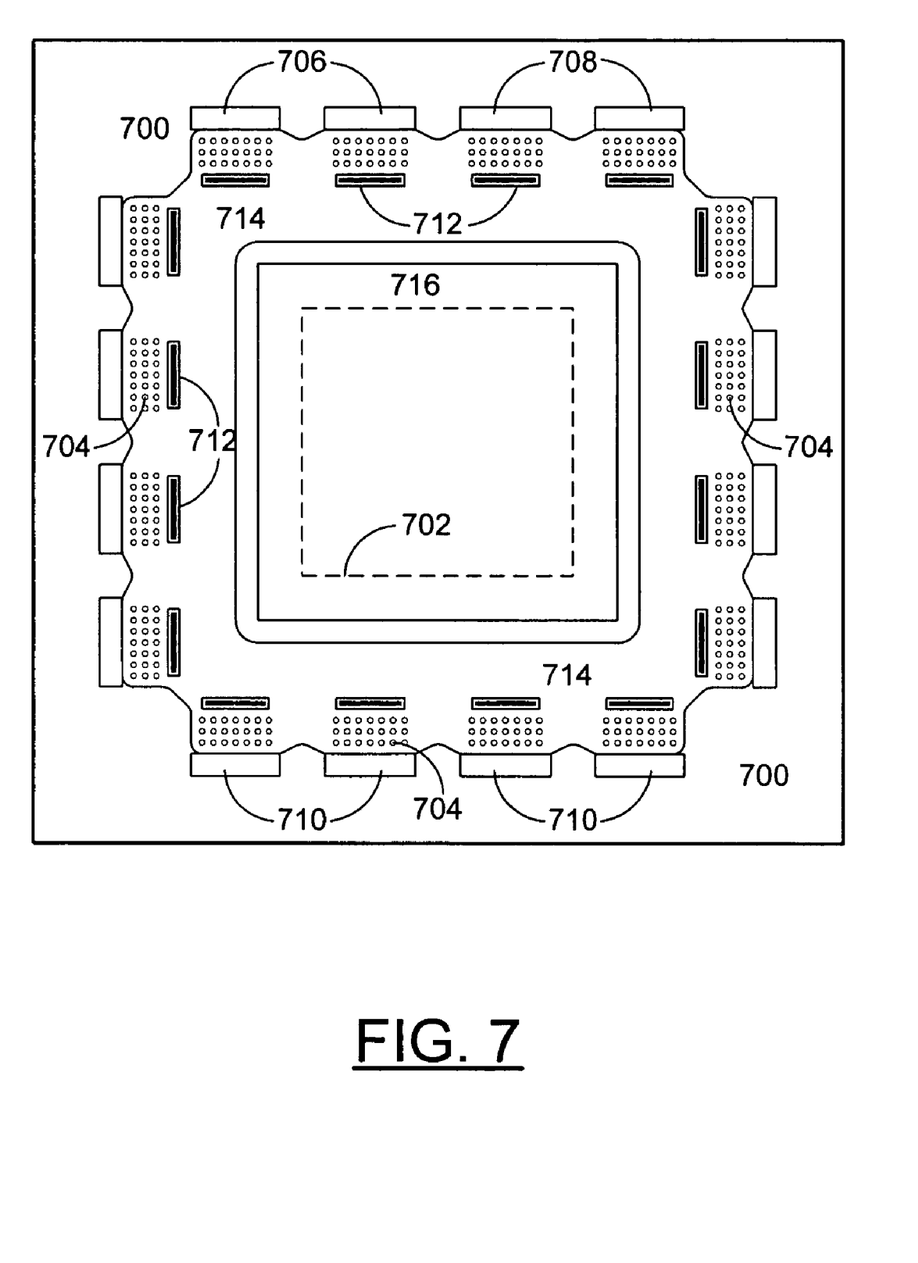
FIG. 7 is a top view of an example embodiment of a VLSI circuit module including a plurality of integrated VCSEL array modules according to the present invention.

FIG. 7 is a top view of an example embodiment of a VLSI circuit module including a plurality of integrated VCSEL array modules according to the present invention. FIG. 7 is identical to FIG. 6 with the exception that a plurality of terminators, translators, or other components are attached to the flexible connector. A standard VLSI package substrate 700 constructed of a common package material, such as a ceramic or organic material, is shown in this example embodiment of the present invention with a single large application specific integrated circuit (ASIC) 702 attached to the substrate 700 underneath a standard heat spreader 716. The ASIC 702 may be any one of a number of integrated circuit devices, such as a microprocessor, memory, crossbar, cache controller, FPGA, or any of a number of large scale integrated (LSI) or very large scale integrated (VLSI) circuits. Also present on the substrate are a quantity of VCSEL array modules 706, receivers 708, and transceivers 710. Signal ports 704 connect the ASIC 702 to the VCSEL array modules 706, receivers 708, and the transceivers 710 through a single large flexible connector 714. Also present on the large flexible connector 714 are a plurality of components 712 such as terminators or translators as needed between the ASIC 702 and the VCSEL array modules 706. The plurality of signal lines connecting the ASIC 702 to the signal ports 704 within the substrate 700 are not shown in this figure for clarity reasons. In an example embodiment of the present invention the VCSEL array modules 706 may incorporate industry standard optical connectors into the module allowing optical connection from the VCSEL array modules 706 using industry standard connections. In this example embodiment of the present invention, the VCSEL circuit is perpendicular to the plane of the substrate 700 and the industry standard connectors are attached such that light is transmitted in a plane parallel to that of the substrate 700. Note that this example embodiment shows a total of 16 VCSEL array modules 706, receivers 708 and transceivers 710. Those of skill in the art will recognize that any number and any combination of VCSEL array modules 706, receivers 708, and transceivers 710 may be used within the scope of the present invention.

Figure 8:
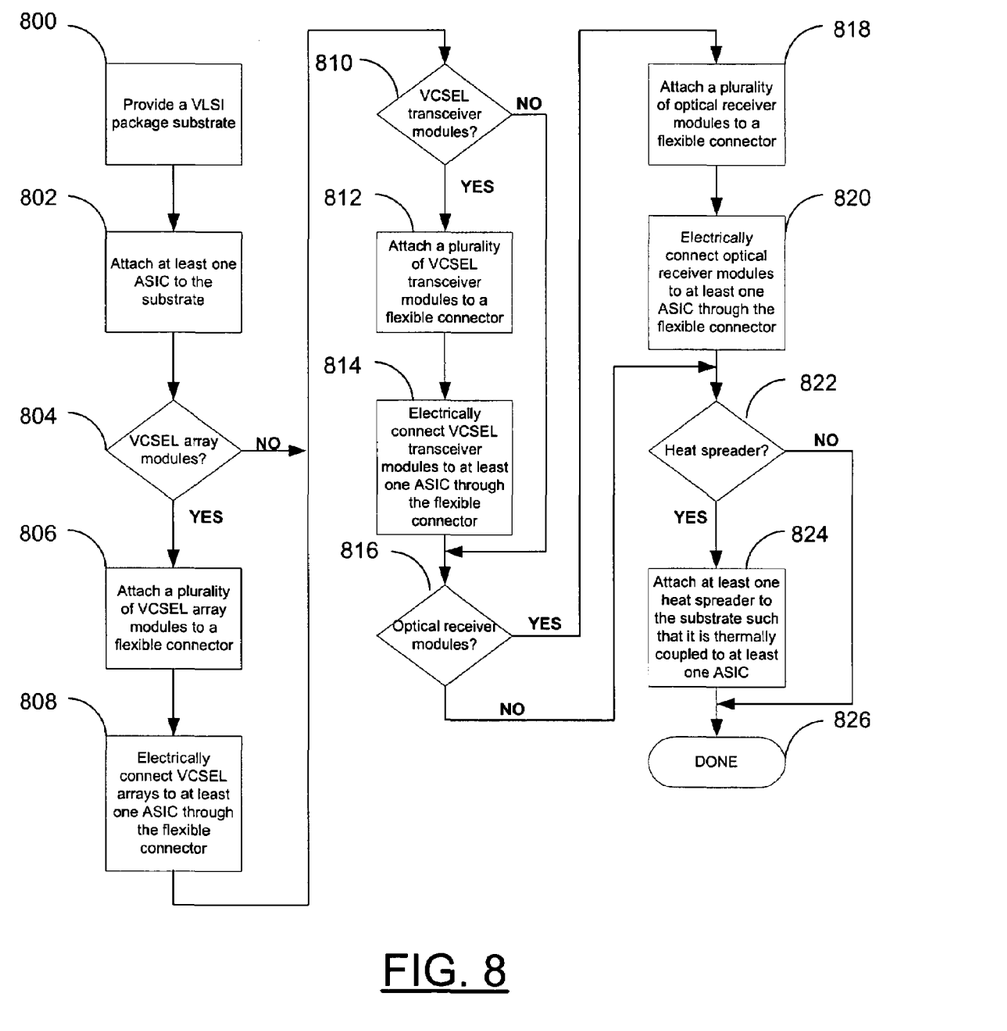
FIG. 8 is a flowchart representing a method for the construction of a VLSI circuit module a plurality of including integrated VCSEL array modules according to the present invention.

FIG. 8 is a flowchart representing a method for the construction of a VLSI circuit module including a plurality of integrated VCSEL array modules according to the present invention. In a step 800 a VLSI package substrate is provided. In a step 802 at least one ASIC is attached to the substrate. In a decision step 804 if VCSEL array modules are to be used, control is passed to step 806, if not, control is passed to step 810. In a step 806, a plurality of VCSEL array modules are attached to a flexible connector. In a step 808, the VCSEL array modules are electrically connected to the ASICs through the flexible connector. In a decision step 810 if VCSEL transceiver modules are to be used, control is passed to step 812, if not, control is passed to step 816. In a step 812 a plurality of VCSEL transceiver modules are attached to a flexible connector. In a step 814 the VCSEL transceiver modules are electrically connected to the ASICs through the flexible connector. In a decision step 816 if optical receiver modules are to be used, control is passed to step 818, if not, control is passed to step 822. In a step 818 a plurality of optical receiver modules are attached to a flexible connector. In a step 820 the optical receiver modules are electrically connected to the ASICs through the flexible connector. In a decision step 822 if a heat spreader is to be added to the module, control is passed to step 824, if not, control is passed to the end step 826. In a step 824 a heat spreader is mechanically attached to the substrate such that it is thermally coupled to at least one ASIC. Those of skill in the art will recognize that the steps in this method may be performed in a very wide variety of different orders within the scope of the present invention.

Figure 9:
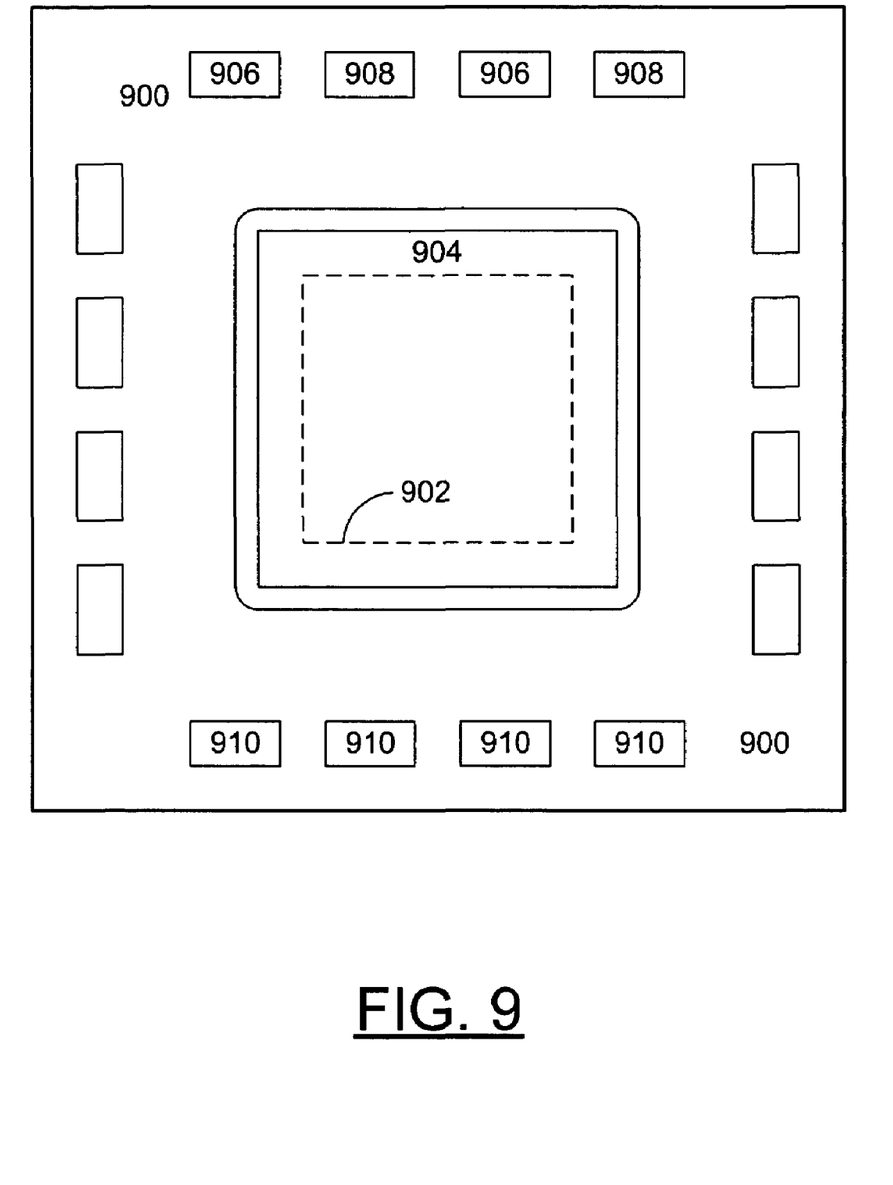
FIG. 9 is a top view of an example embodiment of a VLSI circuit module including a plurality of integrated VCSEL array modules according to the present invention.

FIG. 9 is a top view of an example embodiment of a VLSI circuit module including a plurality of integrated VCSEL array modules according to the present invention. A standard VLSI package substrate 900 constructed of a common package material, such as a ceramic or organic material, is shown in this example embodiment of the present invention with a single large application specific integrated circuit (ASIC) 902 attached to the substrate 900 underneath a standard heat spreader 904. The ASIC 902 may be any one of a number of integrated circuit devices, such as a microprocessor, memory, cross-bar, cache controller, FPGA, or any of a number of large scale integrated (LSI) or very large scale integrated (VLSI) circuits. Also present on the substrate are a quantity of VCSEL array modules 906, receivers 908, and transceivers 910. Note that in this example embodiment of the present invention the VCSEL array modules 906, receivers 908, and transceivers 910 are attached directly to the VLSI package substrate in a vertical configuration through a plurality of signal ports. The plurality of signal lines connecting the ASIC 902 to signal ports within the substrate 900 are not shown in this figure for clarity reasons. In an example embodiment of the present invention the VCSEL array modules 906 may incorporate industry standard optical connectors into the module allowing optical connection from the VCSEL array modules 906 using industry standard connections. In this example embodiment of the present invention the VCSEL array modules 906 are configured in a plane parallel to that of the substrate 900. The light emitted from the VCSEL array modules 906 will be in a plane perpendicular to that of the substrate 900, and any industry standard connections attached to the VCSEL arrays will be in a vertical configuration. Note that this example embodiment shows a total of 16 VCSEL array modules 906, receivers 908 and transceivers 910. Those of skill in the art will recognize that any number and any combination of VCSEL array modules 906, receivers 908, and transceivers 910 may be used within the scope of the present invention.

Figure 10:
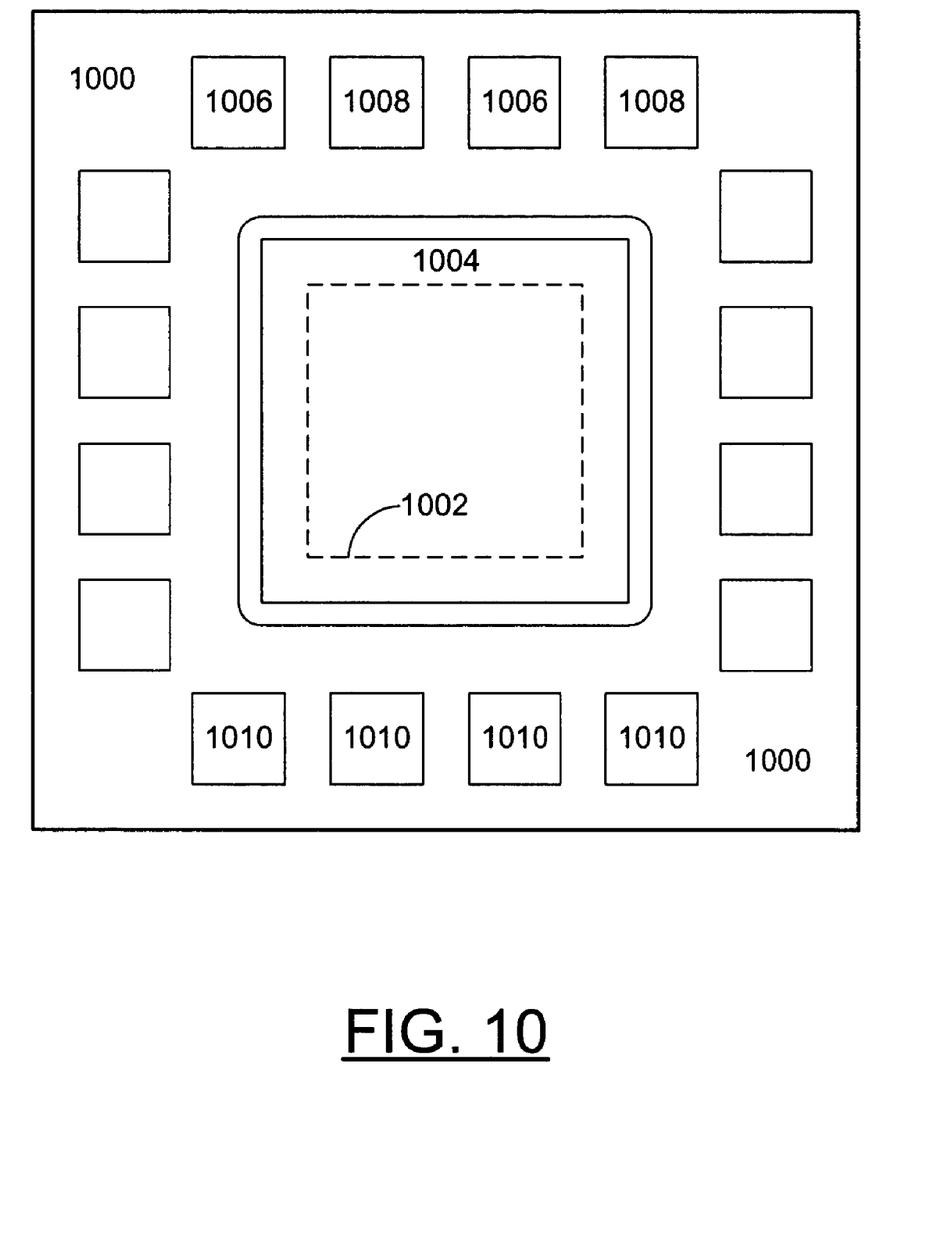
FIG. 10 is a top view of an example embodiment of a VLSI circuit module including a plurality of integrated VCSEL array modules according to the present invention.

FIG. 10 is a top view of an example embodiment of a VLSI circuit module including a plurality of integrated VCSEL array modules according to the present invention. FIG. 10 is identical to FIG. 9 with the exception that the VCSEL array modules 1006, receivers 1008, and transceivers 1010 are attached to the substrate in a horizontal configuration. A standard VLSI package substrate 1000 constructed of a common package material, such as a ceramic or organic material, is shown in this example embodiment of the present invention with a single large application specific integrated circuit (ASIC) 1002 attached to the substrate 1000 underneath a standard heat spreader 1004. The ASIC 1002 may be any one of a number of integrated circuit devices, such as a microprocessor, memory, cross-bar, cache controller, FPGA, or any of a number of large scale integrated (LSI) or very large scale integrated (VLSI) circuits. Also present on the substrate are a quantity of VCSEL array modules 1006, receivers 1008, and transceivers 1010. Note that in this example embodiment of the present invention the VCSEL array modules 1006, receivers 1008, and transceivers 1010 are attached directly to the VLSI package substrate 1000 in a plane parallel to that of the substrate 1000 through a plurality of signal ports. The plurality of signal lines connecting the ASIC 1002 to signal ports within the substrate 1000 are not shown in this figure for clarity reasons. In an example embodiment of the present invention the VCSEL array modules 1006 may incorporate industry standard optical connectors into the module allowing optical connection from the VCSEL array modules 1006 using industry standard connections. The light emitted from the VCSEL array modules 1006 will be in a plane perpendicular to that of the substrate 1000, and any industry standard connections attached to the VCSEL arrays will be in a vertical configuration. Note that this example embodiment shows a total of 16 VCSEL array modules 1006, receivers 1008 and transceivers 1010. Those of skill in the art will recognize that any number and any combination of VCSEL array modules 1006, receivers 1008, and transceivers 1010 may be used within the scope of the present invention.

Figure 11:
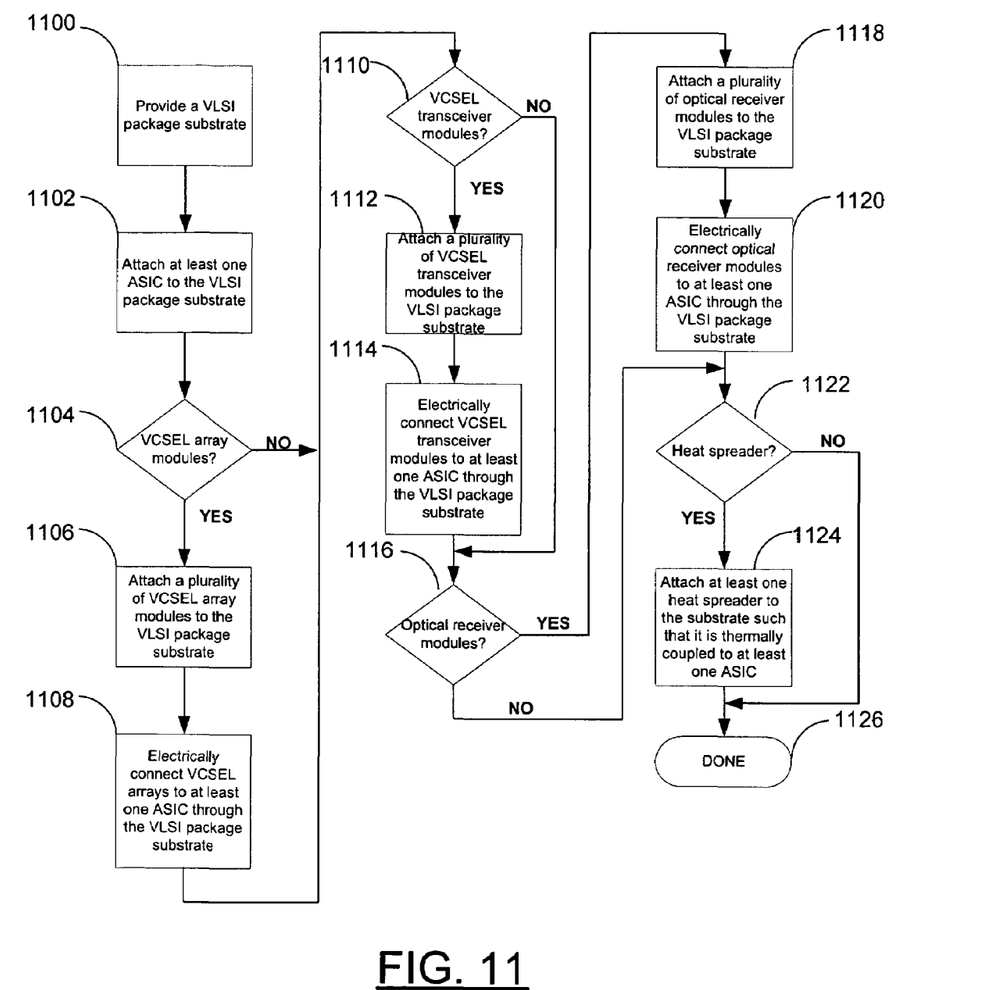
FIG. 11 is a flowchart representing a method for the construction of a VLSI circuit module including a plurality of integrated VCSEL array modules according to the present invention.

FIG. 11 is a flowchart representing a method for the construction of a VLSI circuit module including a plurality of integrated VCSEL array modules according to the present invention. The method shown in FIG. 11 is identical to the method shown in FIG. 8 with the exception that the VCSEL modules are directly attached to the VLSI package substrate instead of being attached through a flexible connector. In a step 1100 a VLSI package substrate is provided. In a step 1102 at least one ASIC is attached to the VLSI package substrate. In a decision step 1104 if VCSEL array modules are to be used, control is passed to step 1106, if not, control is passed to step 1110. In a step 1106, a plurality of VCSEL array modules are attached to the VLSI package substrate. In a step 1108, the VCSEL array modules are electrically connected to the ASICs through the VLSI package substrate. In a decision step 1110 if VCSEL transceiver modules are to be used, control is passed to step 1112, if not, control is passed to step 1116. In a step 1112 a plurality of VCSEL transceiver modules are attached to the VLSI package substrate. In a step 1114 the VCSEL transceiver modules are electrically connected to the ASICs through the VLSI package substrate. In a decision step 1116 if optical receiver modules are to be used, control is passed to step 1118, if not, control is passed to step 1122. In a step 1118 a plurality of optical receiver modules are attached to the VLSI package substrate. In a step 1120 the optical receiver modules are electrically connected to the ASICs through the VLSI package substrate. In a decision step 1122 if a heat spreader is to be added to the module, control is passed to step 1124, if not, control is passed to the end step 1126. In a step 1124 a heat spreader is mechanically attached to the substrate such that it is thermally coupled to at least one ASIC. Those of skill in the art will recognize that the steps in this method may be performed in a very wide variety of different orders within the scope of the present invention.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit module comprising:
   a VLSI package substrate;
   an ASIC attached to said VLSI package substrate;
   at least one flexible connector attached to said VLSI package substrate and electrically coupled to said ASIC; and
   a plurality of VCSEL array modules attached to said at least one flexible connector and electrically coupled to said ASIC through said at least one flexible connector.

2. The circuit module as recited in claim 1, wherein said VCSEL array modules are electrically coupled to said ASIC through said VLSI package substrate and said at least one flexible connector.

3. The circuit module as recited in claim 1 further comprising:
a heat spreader, attached to said VLSI package substrate, and thermally coupled to said ASIC.

4. The circuit module as recited in claim 1 further comprising:
a plurality of optical receiver modules attached to said at least one flexible connector and electrically coupled to said ASIC through said at least one flexible connector.

5. The circuit module as recited in claim 4, wherein said optical receiver modules are electrically coupled to said ASIC through said VLSI package substrate and said at least one flexible connector.

6. A circuit module comprising:
a VLSI package substrate;
an ASIC attached to said VLSI package substrate;
at least one flexible connector attached to said VLSI package substrate and electrically coupled to said ASIC; and
a plurality of optical receiver modules attached to said at least one flexible connector and electrically coupled to said ASIC through said at least one flexible connector.

7. The circuit module as recited in claim 6, wherein said optical receiver modules are electrically coupled to said ASIC through said VLSI package substrate and said at least one flexible connector.

8. The circuit module as recited in claim 6 further comprising:
a heat sink, attached to said VLSI package substrate, and thermally coupled to said ASIC.

9. A circuit module comprising:
a VLSI package substrate;
an ASIC attached to said VLSI package substrate; and
a plurality of VCSEL transceiver modules attached to said at least one flexible connector and electrically coupled to said ASIC through said at least one flexible connector.

10. The circuit module as recited in claim 9 further comprising:
a heat spreader, attached to said VLSI package substrate, and thermally coupled to said ASIC.

11. The circuit module as recited in claim 9 further comprising:
a plurality of VCSEL array modules attached to said VLSI package substrate and electrically coupled to said ASIC through said VLSI package substrate.

12. The circuit module as recited in claim 11 further comprising:
a heat spreader, attached to said VLSI package substrate, and thermally coupled to said ASIC.

13. The circuit module as recited in claim 9 further comprising:
a plurality of optical receiver modules attached to said VLSI package substrate and electrically coupled to said ASIC through said VLSI package substrate.

14. The circuit module as recited in claim 13 further comprising:
a heat spreader, attached to said VLSI package substrate, and thermally coupled to said ASIC.

15. A circuit module comprising:
a VLSI package substrate;
an ASIC attached to said VLSI package substrate;
at least one flexible connector attached to said VLSI package substrate and electrically coupled to said ASIC; and
a plurality of VCSEL transceiver modules attached to said at least one flexible connector and electrically coupled to said ASIC through said at least one flexible connector.

16. The circuit module as recited in claim 15, wherein said VCSEL transceiver modules are electrically coupled to said ASIC through said VLSI package substrate and said at least one flexible connector.

17. The circuit module as recited in claim 15 further comprising:
a heat spreader, attached to said VLSI package substrate, and thermally coupled to said ASIC.

18. The circuit module as recited in claim 15 further comprising:
a plurality of VCSEL array modules attached to said at least one flexible connector and electrically coupled to said ASIC through said at least one flexible connector.

19. The circuit module as recited in claim 18, wherein said VCSEL array modules are electrically coupled to said ASIC through said VLSI package substrate and said at least one flexible connector.

20. The circuit module as recited in claim 18 further comprising:
a heat spreader, attached to said VLSI package substrate, and thermally coupled to said ASIC.

21. The circuit module as recited in claim 15 further comprising:
a plurality of optical receiver modules attached to said at least one flexible connector and electrically coupled to said ASIC through said at least one flexible connector.

22. The circuit module as recited in claim 21, wherein said optical receiver modules are electrically coupled to said ASIC through said VLSI package substrate and said at least one flexible connector.

23. The circuit module as recited in claim 21 further comprising:
a heat spreader, attached to said VLSI package substrate, and thermally coupled to said ASIC.

* * * * *

UNITED STATES PATENT AND TRADEMARK OFFICE
CERTIFICATE OF CORRECTION

PATENT NO. : 6,975,514 B2  Page 1 of 1
APPLICATION NO. : 10/355419
DATED : December 13, 2005
INVENTOR(S) : Terrel L. Morris

It is certified that error appears in the above-identified patent and that said Letters Patent is hereby corrected as shown below:

In column 3, line 31, after "VCSEL" delete "ray" and insert -- array --, therefor.

In column 9, line 39, in Claim 9, delete "said".

Signed and Sealed this

Thirteenth Day of April, 2010

David J. Kappos
*Director of the United States Patent and Trademark Office*